United States Patent [19]
Maynard et al.

[11] 3,955,122
[45] May 4, 1976

[54] HEAT SINK MOUNTING FOR CONTROLLED RECTIFIERS

[75] Inventors: John T. Maynard, New Berlin; Gilbert A. Schwibinger, Oconomowoc, both of Wis.

[73] Assignee: Armor Elevator Company, Inc., Louisville, Ky.

[22] Filed: Feb. 26, 1974

[21] Appl. No.: 445,987

[52] U.S. Cl. ............................... 317/100; 357/81; 165/80
[51] Int. Cl.² ............................... H01L 23/34
[58] Field of Search ............... 317/100; 174/DIG. 5, 174/16 R, 15 R, 68.5; 321/8 C; 310/68 D; 357/74, 75, 81; 165/80

[56] References Cited
UNITED STATES PATENTS

| | | | |
|---|---|---|---|
| 3,480,837 | 11/1969 | Feldmann | 357/81 |
| 3,697,814 | 10/1972 | Christman | 317/100 |
| 3,763,402 | 10/1973 | Shore | 357/81 |
| 3,766,977 | 10/1973 | Pravda | 165/80 |
| 3,789,248 | 1/1974 | Jaecklin | 357/81 |
| 3,812,404 | 5/1974 | Barkan | 357/81 |

*Primary Examiner*—Gerald P. Tolin
*Attorney, Agent, or Firm*—Andrus, Sceales, Starke & Sawall

[57] ABSTRACT

One layer of three heat sinks for conducting alternating current and a second layer of two heat sinks for conducting direct current sandwich twelve controlled rectifiers which are electrically arranged to provide a pair of gated rectifier bridge networks for changing from a current of one frequency to a current of another frequency. Six rod-like bolts are removably secured within threaded openings of certain heat sinks and pass through openings within other heat sinks and assist together with locking nuts in compressing the sandwiched assembly. Three of the bolts are electrically insulated from the direct current heat sinks for supplying alternating current to the rectifying devices through the alternating current heat sinks while two of the bolts are electrically insulated from the alternating current heat sinks for conducting direct current to the rectifying devices through the direct current heat sinks.

An alternative embodiment employs two layers each comprising one heat sink for conducting direct current and a third layer of three heat sinks for conducting alternating current for sandwiching two layers of controlled rectifiers each including six rectifying devices. Three rod-like bolts are removably secured within threaded openings of one D. C. heat sink and pass through openings within the opposite D. C. heat sink and the A. C. heat sinks and assist together with locking nuts in compressing the sandwiched assembly. Two of the bolts conduct direct current to the rectifiers through the two D. C. heat sinks and are electrically insulated from the A. C. heat sinks. Alternating current is connected directly to the A. C. heat sinks.

The bolts utilized in the invention further secure inductance cores, provide an electrical connection to an input-output circuit, provide an electrical connection to a printed circuit board, provide a connection to a cabinet, and provide a primary circuit for current sensing transformers. The plurality of heat sinks are oriented so that the cooling fins of all layers are in parallel alignment.

30 Claims, 10 Drawing Figures

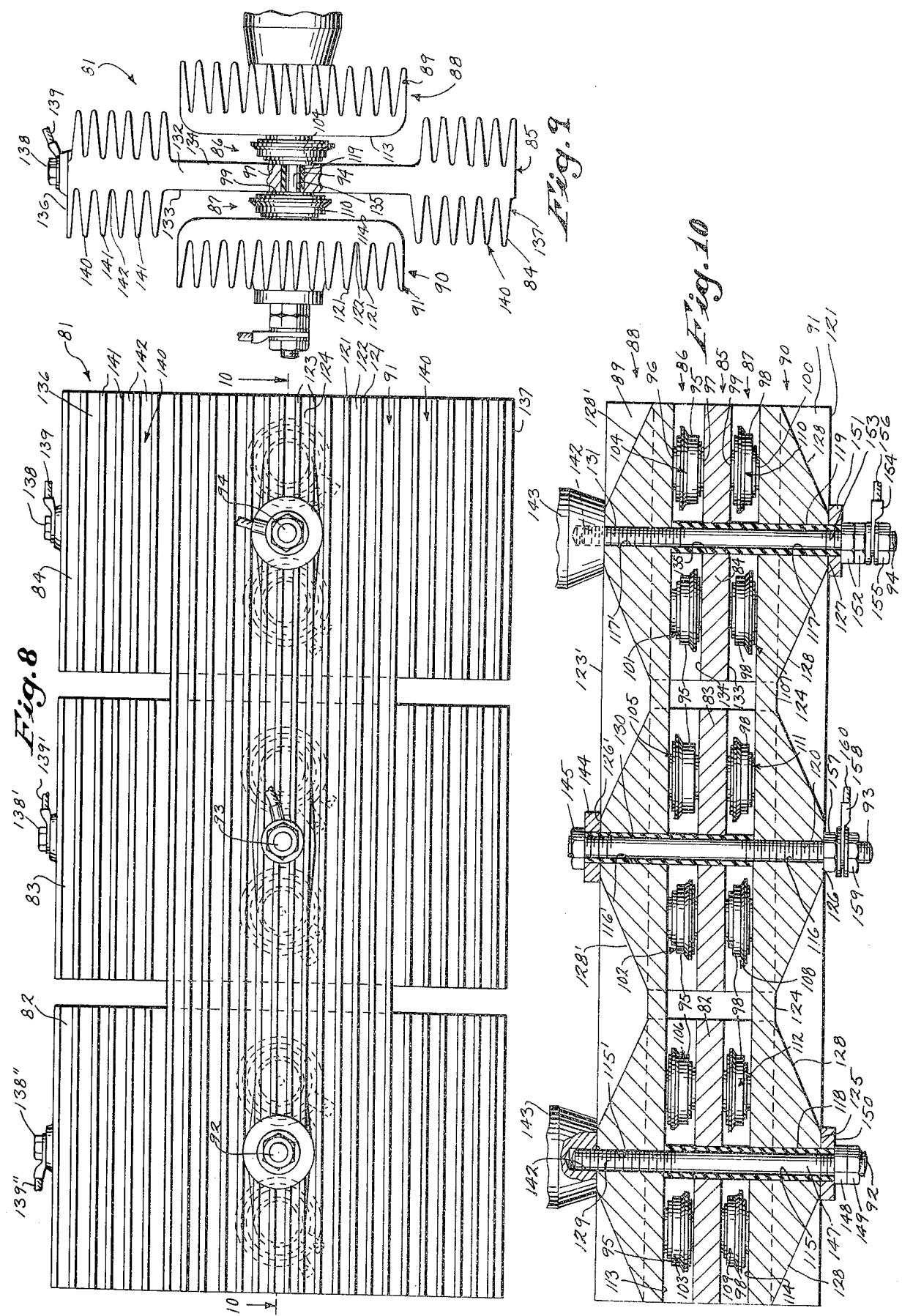

HEAT SINK MOUNTING FOR CONTROLLED RECTIFIERS

BACKGROUND OF THE INVENTION

This invention relates to an assembly for securing an electric power rectifying means.

Various mounting assemblies have been employed for removing heat from solid state rectifying devices, such as silicon controlled rectifiers, diodes or other similar solid state elements. Some known assemblies have employed a pair of heat sinks on opposite sides of each rectifying device which have provided outer cooling fins disposed away from the rectifying devices for dissipating the heat therefrom. Such heat sinks have not only been utilized for cooling purposes but have also provided electrical terminals for supplying electrical energy to and from the controlled rectifier device. Such arrangements have generally utilized a complex clamping arrangement for firmly securing the adjacent heat sinks to the sandwiched rectifying device for maintaining good electrical and thermal conductively therebetween. In addition, such prior devices have generally required cumbersome and extension wiring connections to and from the heat sinks.

SUMMARY OF THE INVENTION

This invention relates to an assembly for securing an electric power rectifying means for changing from a first current frequency to a second current frequency to provide a desired electrical power output.

One aspect of the invention includes a configuration in which the rectifying means is removably sandwiched between a first heat sink means and a second heat sink means with the heat sinks being maintained in good electrical and thermal conductive engagement with the rectifying means. The sandwiched rectifier configuration is held together by clamping means which also conducts current to the rectifier means through the heat sink means. Thus, a portion of the clamping means conducts current to the first heat sink means and is electrically insulated from the second heat sink while another portion of the clamping means conducts current to the second heat sink means and is electrically insulated from the first heat sink means.

A current conducting clamping means which is thus electrically connected to one heat sink means passes through an opening of one or more layers of other heat sink means to maintain the rectifying means in a sandwiched relationship. Insulation is provided at or near the opening in the heat sink means to electrically insulate the adjacent current conducting means therefrom. In operation, the clamping means conducts current of one frequency to the rectifying means through one heat sink means while a current of a second frequency is supplied to the rectifying means through another heat sink means. Such arrangement could thus be conveniently utilized in converting A. C. power to D. C. power, D. C. power to A. C. power, or A. C. power of one frequency to A. C. power of a second frequency.

In a preferred form of the invention, the assembly secures a plurality of twelve rectifying devices which receive a first current frequency input and selectively provides a second current frequency output to a motor armature circuit. Six securing members such as bolts with associated nuts are utilized for stacking and clamping three first current conducting heat sinks in a spaced relationship within a common first plane and two second current conducting heat sinks in spaced relationship within a common second plane. The plurality of rectifying devices are thus sandwiched in thermal and electrically conductive relationship between the heat sinks of the first plane and the heat sinks of the second plane. Each of the six clamping members is generally located adjacent to two rectifying devices and is effective for transmitting uniform clamping pressure so that each rectifier establishes good thermal and electrical conductivity with adjacent heat sinks. The three heat sinks in one plane and two heat sinks in the other plane are thus capable through the use of the six securing member to retain the twelve rectifiers under a uniform compression. Such balanced clamping eliminates the possibility of a poor electrical contact at any one rectifier which might introduce added circuit impedance thereby resulting in an inbalanced current load and an unsatisfactory operation.

The two second current conducting heat sinks within the second plane each have a longitudinal orientation which is angularly displaced from the longitudinal orientation of each of the first current heat sinks within the first plane. Specifically, the heat sinks in one plane are orientated at a 90° relationship with respect to the heat sinks of the other plane to provide the proper electrical polarity contact with the 12 rectifiers while maintaining a compact assembly. The first current heat sinks each include a plurality of longitudinally orientated cooling fins while the second current heat sinks each include a plurality of widthwise cooling fins. Thus when the sinks are mounted in clamping relationship, the fins of the second current heat sinks are spaced in a substantial parallel relationship with respect to the fins of the first current heat sinks. Such parallel relationship between the cooling fins of all heat sinks permits efficient cooling by the unidirectional flow of a coolant, such as forced air.

Each of the heat sinks includes valleys located between adjacent cooling fins. Certain of the valleys are spaced in substantially parallel relationship with respect to the adjacent cooling fins while other valleys are angularly orientated with respect to adjacent cooling fins, the latter generally intercepting an outer surface used for receiving the securing members. The angularly orientated valleys assist in transmitting pressure to the entrapped rectifying devices and generally stabilize each heat sink while further permitting rapid heat dissipation.

The five heat sinks within the two planes each have a plurality of openings for retaining the clamping or securing members in a spaced relationship. Specifically, a first heat sink retains first and fourth clamping members, a second heat sink retains a second and sixth clamping members, a third heat sink retains a third and fifth clamping members, a fourth heat sink retains the first, fifth and sixth clamping members while a fifth heat sink retains the second, third and fourth clamping members. In the embodied form of converting from A. C. power to D. C. power, the first, second and third heat sinks conduct alternating current while the fourth and fifth heat sinks conduct direct current.

The clamping means is operably connected to a plurality of securing members and to the plurality of heat sinks for applying pressure upon the plurality of rectifying devices. Specifically, the plurality of securing members each include an electrically conductive element, such as a metal rod-like bolt made of brass or the like, which provides threads for engaging threaded openings within certain heat sinks and further receive locking nuts. A plurality of nuts together with the possible use of washers and insulators are generally secured to the opposite ends of each bolt to firmly clamp the rectifiers between the heat sinks and apply compression upon the assembly. Sufficient preselected torque is applied to the nuts to ensure good thermal and electrical contact between the rectifying devices and the adjacent heat sinks.

At least five clamping members are utilized in the assembly to conduct power to and from the 12 rectifiers, three for conducting the three phases of alternating current and two for conducting the direct current. A plurality of insulating sleeves are connected to selected portions of the securing bolts and within certain of the openings provided by the heat sinks thereby permitting clamping members to be utilized as current conductors. Specifically, the three alternating current conducting bolts are electrically insulated from the direct current heat sinks while the two direct current conducting bolts are electrically insulated from the alternating current heat sinks. Additional securing bolts are generally electrically insulated from either or both of the direct current and alternating current heat sinks. In such manner, the securing bolts together with the locking nuts not only transmit pressure upon the heat sinks and rectifying devices, but are also connected to conduct electrical power to and from the rectifying devices thereby eliminating the need for additional or cumbersome wiring conductors generally required in the past.

In operation, three of the clamping members conduct three phase alternating current from an input source to the rectifying devices through the three alternating current conductive bolts and the three alternating current heat sinks while two of the clamping members selectively conduct forward and reverse direct current from the plurality of rectifying devices through the two direct current heat sinks and the two direct current conductive bolts to the D. C. motor armature circuit. Additional securing bolts are contemplated within the scope of applicants' invention for securing the plurality of rectifying devices and possibly conducting current.

One or more current sensing transformers are conveniently placed adjacent to one or more of the current conducting clamping members and electrically coupled thereto for providing one or more output signals which are proportional to the sensed current flowing through the clamping members. Toroidal shaped transformer elements are preferably placed about selected current conducting bolts, the latter thus acting as a primary circuit in the transformer arrangement. The outputs from such current sensing transformers are preferably utilized in the armature regulating circuit for motor control.

Inductive elements are also coupled about the current conductive bolts for adding series line inductance to the current input. Specifically, one or more toroidal shaped line inductor cores are electrically coupled to the current conducting bolts for adding the requisite inductance.

The plurality of clamping members are also utilized for securing the plurality of mounted rectifying devices to a fixed object. Specifically, four of the securing bolts are connected to insulating members which, in turn, are connected to a mounting structure such as a cabinet or the like for securely holding the assembly. The insulating members prevent the cabinet or other adjacent objects from being electrically energized by the current flowing through the securing members.

A printed circuit board is also connected to the plurality of current conducting clamping members for mounting various circuit components generally utilized for motor control. Specifically, the printed circuit board contains openings for surrounding the five current conducting clamping members and contains electrically conductive foil or the like which is electrically connected to the clamping members. The utilization of one or more printed circuit boards permits the convenient placement of fuses and other circuit elements adjacent to the current conducting clamping bolts. The printed circuit board is utilized to distribute currents and voltages in addition to mounting large, heavy components, such as all fuses, magnetic amplifiers, and various other components. For example, two current transformers are connected to the printed circuit board adjacent to the plurality of heat sinks and surround two of the current conductive bolts. In addition, the toroidal shaped line inductor cores are mounted about the portion of the current conductive bolts adjacent to the printed circuit board. The compact interrelationship between large and numerous circuit components including the five heat sinks and twelve rectifiers existing in applicants' invention permits convenient and easy access to such circuitry for testing and possible repair.

The heat sinks are preferably of cast aluminum which contain a degree of inherent elasticity to permit the controlled rectifiers to seat between adjacent heat sinks to establish excellent electrical contact and permit maximum heat transfer. The inherent elasticity of the aluminum heat sinks permits compensation for the possible mechanical deviation in thickness frequently existing between adjacent controlled rectifiers. The ready adjustment of torque on the plurality of nuts which engage the threaded securing bolts together with the inherent elasticity of the aluminum heat sinks permits the establishment of a preferred preselected compression upon the twelve rectifying devices and further permits their ready removal should such devices fail.

The clamping force exerted upon the 12 rectifying devices remains substantially stable without deviation when operating over a wide temperature range customarily encountered in a dual bridge network.

An alternative embodiment of the invention employs three levels or layers of heat dissipating elements which are used to sandwich two levels or layers of controlled rectifiers. Two oppositely disposed outer layers of heat dissipating elements each includes one heat sink which is connected for conducting direct current to the two layers of controlled rectifiers. The third or intermediate layer of heat dissipating elements includes three spaced heat sinks which are connected for conducting the three phases of alternating current to the two layers of controlled rectifiers. Thus one layer of controlled rectifiers is sandwiched between the intermediate layer of alternating current conducting heat sinks and a first outer heat sink while the second layer of controlled rectifiers is sandwiched between the intermediate layer and a second outer heat sink.

Three rod-like bolts are each placed within openings of the two outer direct current conducting heat sinks and within an opening of one of the alternating current heat sinks for maintaining the sandwiched relationship of the assembly and to assist in applying pressure upon the sandwiched rectifiers. Specifically, threaded portions of the bolts engage the threaded openings of one of the outer direct current conducting heat sinks to establish good electrical contact between the bolt and connected heat sink. The threaded bolts also removably receive nuts or threaded insulators which are adjusted to engage the outer heat sinks for compressing the sandwiched assembly.

A first bolt in the alternative embodiment is thus electrically connected to a first outer heat sink and insulated from a second outer heat sink and further insulated from the sandwiched third heat sink. In like manner, a second bolt is electrically connected to the second outer heat sink and electrically insulated from the first outer heat sink and further insulated from the sandwiched third heat sink. The third bolt is electrically insulated from the intermediate third heat sink and either or both of the outer heat sinks. The first and second bolts are thus electrically connected to supply direct current to the two rectifier layers through the two outer heat sinks.

The alternative embodiment employs many of the features and advantages as discussed with respect to the preferred embodiment such as further utilization of the bolts for physical and electrical connection to a printed circuit board, for connection with inductance cores for smoothing the current conducted therethrough, for coupling with sensing transformers for providing an output signal proportional to current flow, and for connection to a mounting assembly.

It is therefore evident that the invention provides a highly desirable assembly for securing a plurality of electrical power converting rectifying devices. The assembly provides excellent cooling characteristics while maintaining desirable clamping forces upon the plurality of rectifiers to ensure good thermal and electrical conductivity between the rectifiers and heat sinks. The assembly utilizes the specially designed securing members for many mechanical and electrical purposes including the supplying of electrical current to the plurality of rectifying devices.

BRIEF DESCRIPTION OF THE DRAWINGS

The drawings furnished herewith illustrate both a preferred and alternative construction of the present invention in which the above advantages and features are clearly disclosed, as well as others which will be clear from the following description.

In the drawings:

FIG. 8 is a front elevational view of an alternative embodiment showing an assembly securing two layers of rectifying devices;

FIG. 9 is a side elevational view of the assembly of FIG. 8; and

FIG. 10 is a section view taken along the lines 10—10 in FIG. 8.

DESCRIPTION OF THE PREFERRED ILLUSTRATED EMBODIMENT

Figure 1:
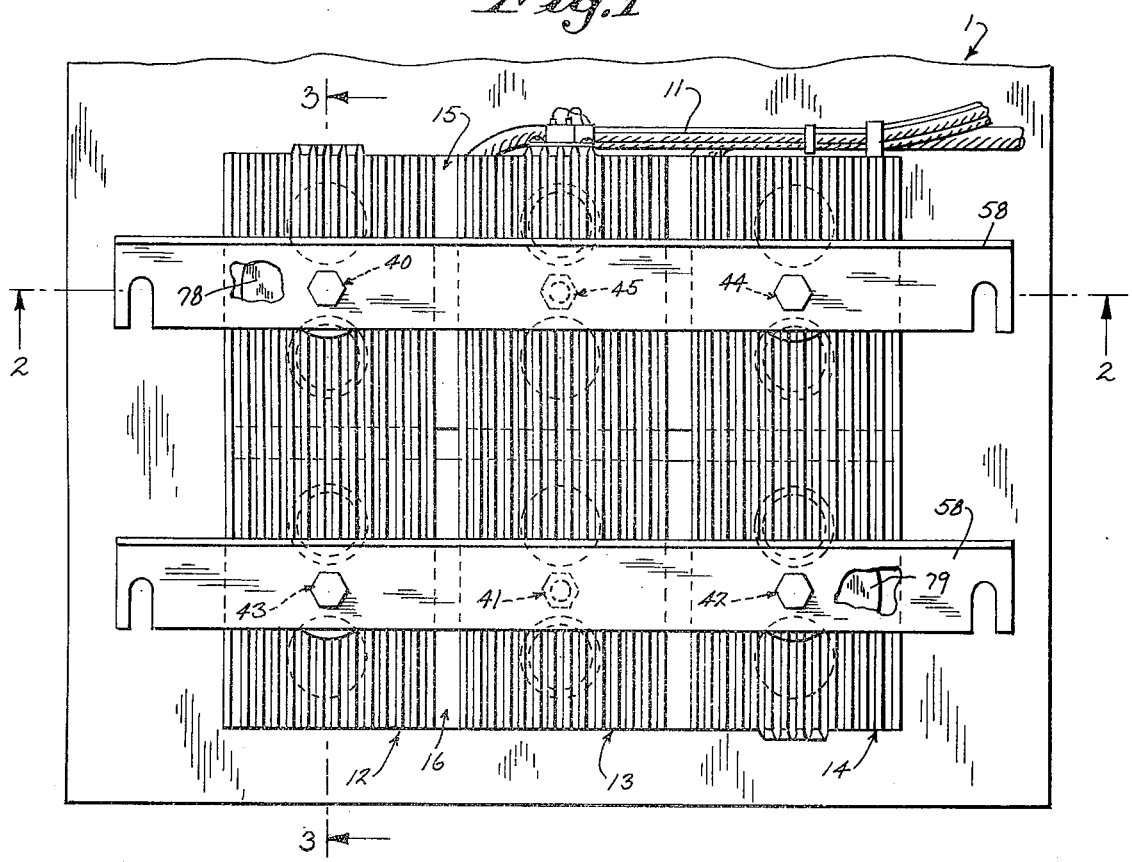
FIG. 1 is a back elevational view of the preferred embodiment showing an assembly securing a single layer of rectifying devices.

Referring to the drawings, an assembly 1 is shown for securing a plurality of rectifying devices 2 which are electrically connected to receive a three phase alternating current input and selectively supply forward and reverse direct current to a DC motor armature circuit. Specifically, 12 silicon controlled rectifiers are electrically interconnected to form a pair of gated rectifier bridge networks having common AC input and DC output leads, as more fully described hereinafter, which are utilized in any one of a number of direct current motor control circuits, such as shown and described in the patent to Maynard, U.S. Pat. No. 3,716,771, issued on Feb. 13, 1973.

The controlled rectifiers 2 are orientated in spaced relationship with respect to each other in a substantially common plane or layer 3 so that they contact both an alternating current heat sink means 4 located substantially within a plane or layer 5 and a direct current heat sink means 6 located substantially within a plane or layer 7. Thus, the plurality of rectifying devices 2 are sandwiched between the AC heat sink means 4 and the DC heat sink means 6. Six rectifying devices 8 of controlled rectifiers 2 have their cathodes electrically connected to the AC heat sink 4 and their anodes connected to the DC heat sink 6 while the remaining six rectifying devices 9 have their anodes connected to the AC heat sink 4 and their cathodes connected to the DC heat sink 6. The rectifying devices 8 and 9 each contain a gating and control circuit 10 which is connected through leads 11 to appropriate control circuitry, such as described in the U.S. Pat. No. 3,716,771, and need not be further discussed herein.

The AC heat sink means 4 includes a heat sink for each incoming phase including a heat sink 12, a heat sink 13, and a heat sink 14 which are mounted in spaced relationship with respect to each other and aligned substantially within the common plane 5. The DC heat sink means 6 includes a heat sink for each output including a heat sink 15 and a heat sink 16 which are mounted in spaced relationship with respect to each other and aligned substantially within the common plane 7.

The AC heat sinks 12, 13, and 14 and the DC heat sinks 15 and 16 are each formed from an aluminum alloy by permanent molded castings and have been found to provide excellent resistance to corrosion while providing good conduction of heat and electricity.

The rectifiers 2 are shown as disc-shaped elements each having a pair of flat outer contact surfaces 2a and 2b which are oppositely spaced by a generally uniform thickness. It has been found that the use of an aluminum alloy permits the heat sinks to act as a spring or sponge and conform to the natural shape of the controlled rectifier control surfaces and permit ready adjustment for minor deviations in thickness frequently found within commercial controlled rectifiers.

Figure 3:
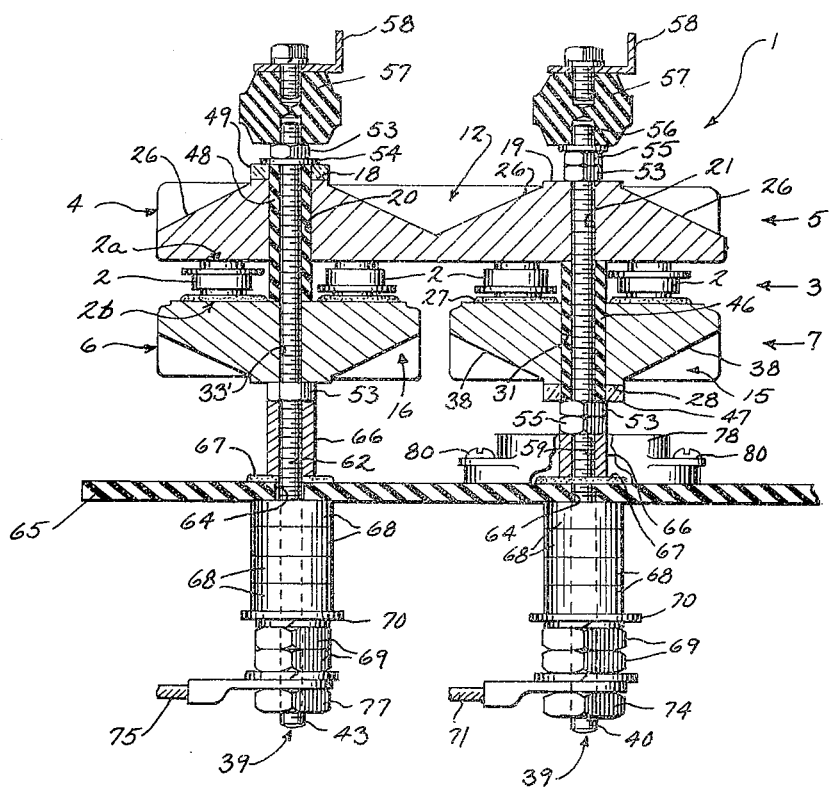
FIG. 3 is a sectional view taken along the lines 3—3 in FIG. 1.
Figure 4:
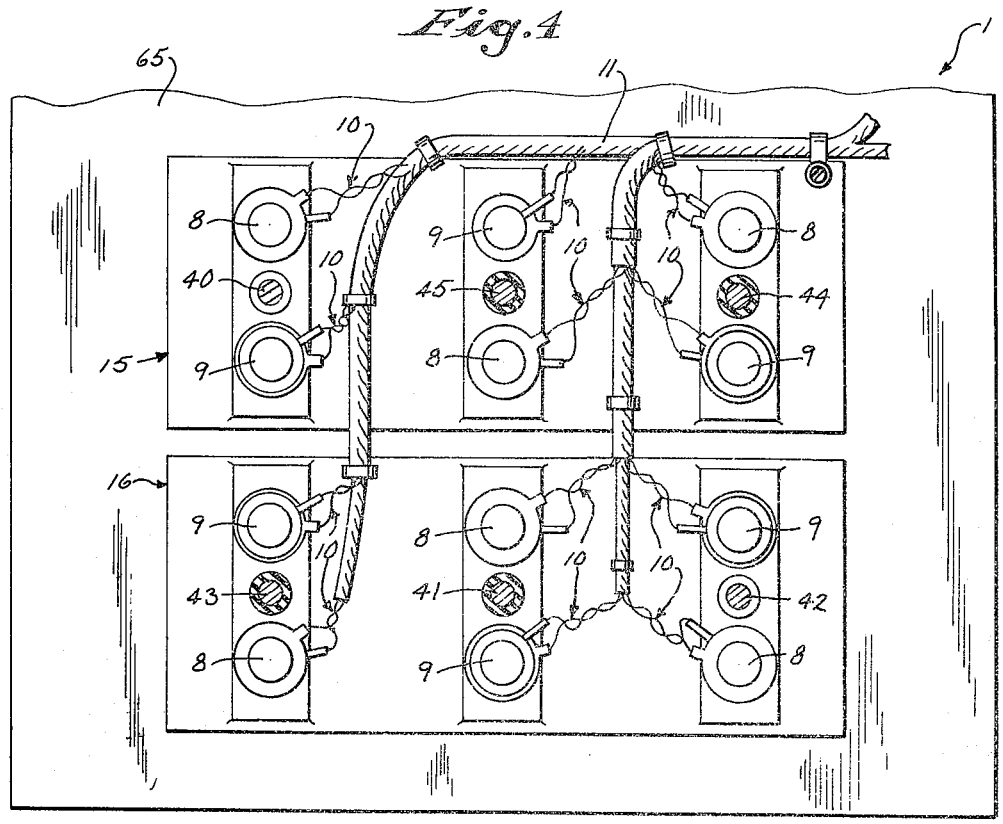
FIG. 4 is a sectional view taken along the lines 4—4 in FIG. 2.
Figure 5:
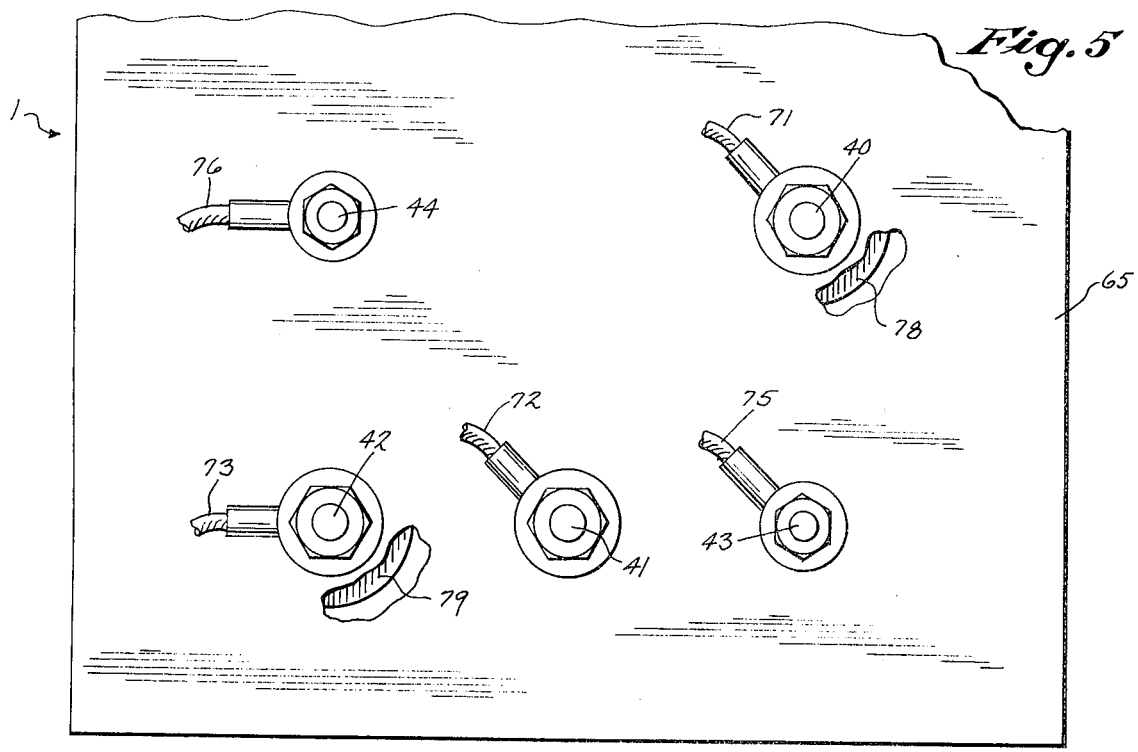
FIG. 5 is a front elevational view showing the assembly of FIG. 1.

The AC heat sinks 12, 13, and 14 are substantially similar to one another so that heat sink 12 as shown in FIG. 5 will be discussed in detail and similar feature of heat sinks 13 and 14 will be designated by the same numbers primed and double-primed, respectively. Specifically, the heat sink 12 includes a base portion 17 which engages the contact surfaces of certain of the controlled rectifiers 2 to provide electrical and thermal contact therewith, as shown in FIG. 3. The heat sink 12 further includes a pair of spaced surfaces 18 and 19 which contain openings or bores 20 or 21, respectively, which appear as openings within the base portion 17. The bores 20 and 21 are substantially cylindrical in shape for receiving a bolt and possibly an insulating member as will be described more fully hereinafter. The bores 20 and 20'' of heat sinks 12 and 14, respectively, have a slightly larger diameter than bores 21 and 21'' while bores 20' and 21' of heat sink 13 have substantially the same diameter.

The heat sink 12 further includes a heat removal portion 22 which includes a plurality of spaced fins or ribs 23 which are separated by adjacent valleys 24. The ribs 23 and valleys 24 extend substantially across the length of the heat sink 12 except at where they are interrupted by the surfaces 18 and 19. The valleys 24 which are located between each surface 18 and 19 and the adjacent side edges 25 are substantially parallel to the adjacent ribs 23 and the surfaces 18 and 19. The valleys 24 which fail to run the length of the AC heat sink 12 because of the interruption caused by surfaces 18 and 19, however, are not parallel to adjacent ribs 23 but rather form sloping surfaces 26 which are at an acute angle to the adjacent surfaces 18 and 19 and to the adjacent ribs or fins 23. The gradual sloping surfaces provided by valleys 26 assists in the transfer of compressive forces applied to surfaces 18 and 19 while also readily conducting heat to fins 23.

Figure 6:
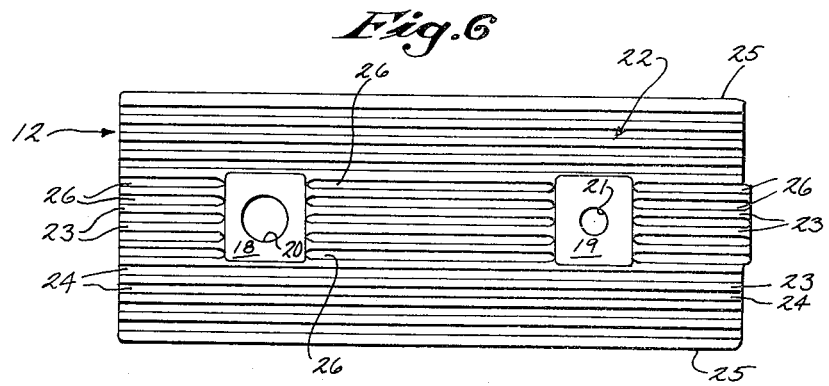
FIG. 6 is an elevational view of a AC heat sink utilized in the assembly shown in FIG. 1.
Figure 7:
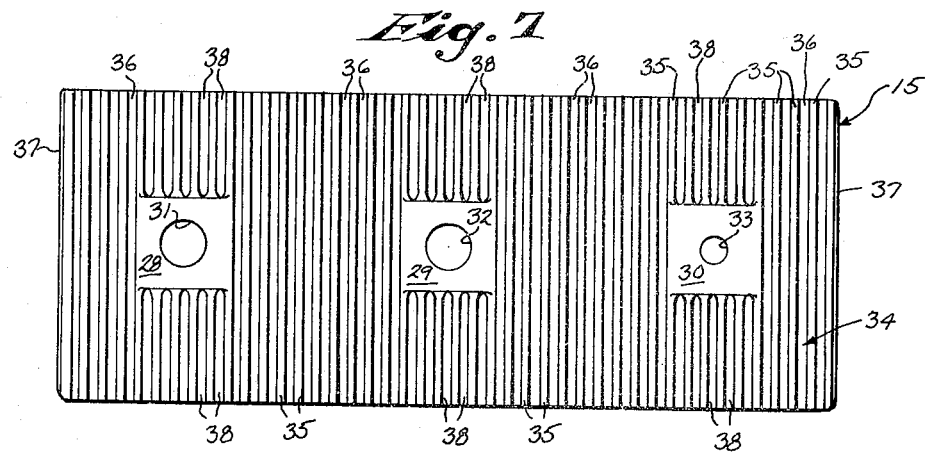
FIG. 7 is an elevational view of a DC heat sink utilized in the assembly shown in FIG. 1.

The heat sinks 15 and 16 are substantially similar to each other so that heat sink 15 as shown in FIG. 6 will be discussed in detail and similar features of heat sink 16 will be designated by identical numbers primed. Specifically, the heat sink 15 includes a substantially flat base portion 27 which engages certain of the controlled rectifiers 2 to provide electrical and thermal contact therewith. A plurality of outer surfaces 28, 29 and 30 each contain an opening or bore 31, 32 and 33, respectively, which are substantially cylindrical in shape and appear as openings within the base portion 27. The bores 31 and 32 are slightly larger in diameter than bore 33 for receiving insulating members which will be discussed more fully hereinafter.

The heat sink 15 further provides a heat removal portion 34 which includes a plurality of fins or ribs 35 which are separated by adjacent valleys 36 and generally extend across the width of the heat sink 15 except where they are interrupted by the surfaces 28, 29 and 30. The valleys 36 located between adjacent surfaces 28, 29 and 30 and between the surfaces 28 and 30 and the corresponding adjacent outer ends 37 are substantially parallel with the adjacent ribs 35 and the surfaces 28, 29 and 30. The valleys 36 which fail to extend across the width of the heat sink 15 because of the interruption caused by surfaces 28, 29 and 30 are not parallel to the adjacent ribs 35 but rather provide sloping surfaces 38 which are at an acute angle to the adjacent surfaces 28, 29 and 30 and to the adjacent ribs or fins 35. The sloping surfaces 38 operate in a similar manner as sloping surfaces 26 within heat sink 12.

A plurality of securing members 39 include six bolts made of electrically conductive material, such as brass, which are selectively positioned within certain of the bores 20 and 21 of the alternating current heat sinks 12, 13 and 14 and bores 31, 32 and 33 of the direct current heat sinks 15 and 16. The securing members 39 are thus effective for retaining the AC heat sink means 4 in a spaced relationship with respect to the DC heat sink means 6 for removably securing the plurality of rectifying devices 2 therebetween. In addition, the securing members 39 along with the rectifying device 2 maintain the individual heat sinks within the AC heat sink means 4 and the DC heat sink means 6 spaced with respect to each other.

Specifically, an alternating current conductive bolt 40 is positioned within bore 21 of heat sink 12 and bore 31 of heat sink 15 to provide a first securing member. An alternating current conductive bolt 41 is positioned within bore 21' of heat sink 13 and within bore 32' of heat sink 16 to provide a second securing member. In addition, an alternating current conductive bolt 42 is positioned within bore 21'' of heat sink 14 and within bore 31' of the heat sink 16 to provide a third securing member.

A direct current conductive bolt 43 is positioned within bore 20 of the heat sink 12 and within bore 33' of the heat sink 16 to provide a fourth securing member. A direct current conductive bolt 44 is positioned within the bore 20'' of the heat sink 14 and within bore 23 of the heat sink 15 to provide a fifth securing member. Lastly, a bolt 45 is positioned within the bore 20' of the heat sink 13 and within bore 32 of the heat sink 15 to provide a sixth securing member.

Figure 2:
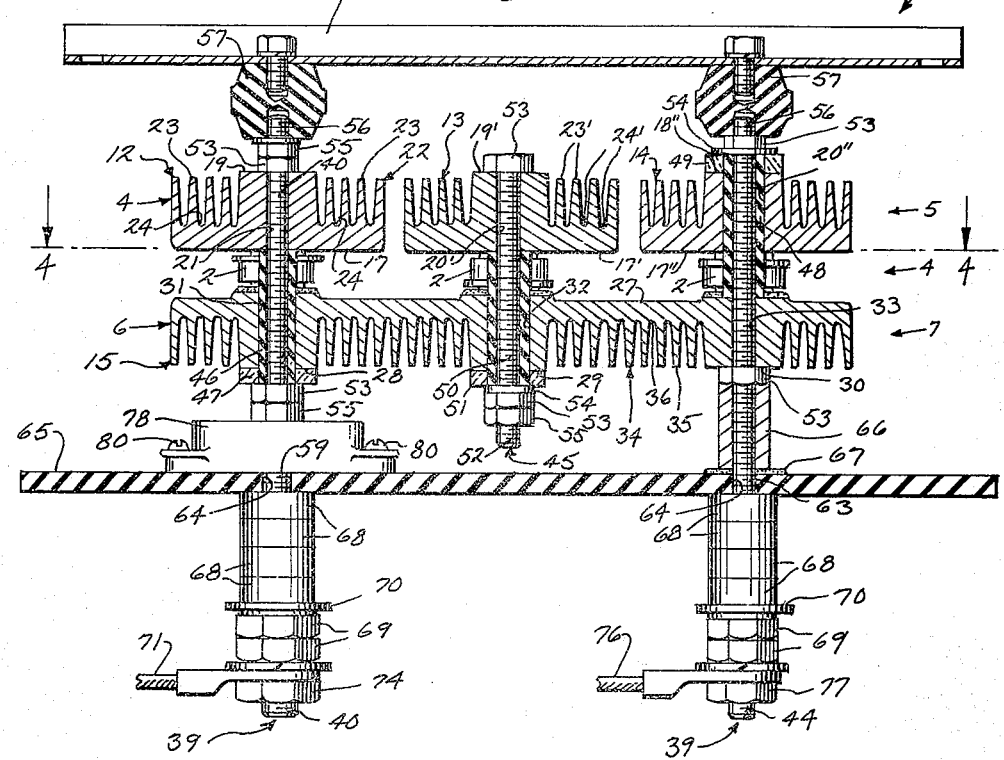
FIG. 2 is a sectional view taken along the lines 2—2 in FIG. 1.

A plurality of cylindrically shaped insulating tubes or sleeves 46 are positioned within certain bores of the heat sinks and surround certain portions of the conductive bolts 40, 41 and 42 to electrically insulate the AC conducting rods or bolts from the direct current heat sinks 15 and 16. With reference to FIGS. 2 and 3, an insulating tube 46 is positioned within bore 31 of heat sink 15 and within bores 31' and 32' of heat sink 16 and each extend beyond the base portions 27 and 27' and the respective outer surfaces 28, 28' and 29' to completely electrically separate the AC conductive bolts from the respective adjacent direct current heat sinks. The further complete the insulation, a plurality of insulating washers 47 are positioned about certain of the projecting end portions of insulating sleeves 46 and abut the corresponding adjacent outer surfaces 28, 28' and 29' of the respective heat sinks to maintain complete electrical insulation between the conductive bolts and the heat sinks.

A plurality of cylindrically shaped insulating tubes or sleeves 48 are further positioned within certain bores of the heat sinks and surround certain portions of the bolts 43 and 44 to electrically insulate the DC conducting rods or bolts from the AC heat sinks 12 and 14. Specifically, the insulating sleeves 48 are identical to sleeves 47 and are positioned within bore 20 of the heat sink 12 and bore 20'' of heat sink 14. The sleeves 48 extend outeardly beyond the base portions 17 and 17'' and the surface 18 and 18'' to completely electrically insulate the DC conducting bolts 43 and 44 from the AC heat sinks 12 and 14, respectively. A plurality of insulating washers 49 are further positioned about certain of the projecting end portions of insulating sleeves 48 and abut the corresponding adjacent outer surfaces 18 and 18'' of respective AC heat sinks 12 and 14 to further complete the electrical insulation between the conductive bolts 43 and 44 and the AC heat sinks.

A cylindrical shaped insulating tube or sleeve 50 similar to sleeves 46 and 48 is positioned to surround the bolt 45 and electrically insulates the sixth securing member from the DC heat sink 15. Specifically, the sleeve 50 is positioned within bore 32 of heat sink 15.

An insulating washer 51 surrounds the projecting end of sleeve 50 and abuts outer surface 29 of heat sink 15 to provide complete electrical insulation between the bolt 45 and the DC heat sink 15.

A preselected compression is placed upon the AC heat sink means 4 and the DC heat sink means 6 so that the sandwiched plurality of controlled rectifiers 2 are retained in good thermal and electrical connection. Certain of the bores or openings within the heat sinks are threaded to engage the external threads 52 on the securing bolts for securing the heat sinks under compression and for also maintaining good electrical and thermal contact between the bolts and certain of the heat sinks. Specifically, the threaded openings include opening 21 within heat sink 12 for releasably securing bolt 40, opening 20' within heat sink 13 for releasably securing bolt 45, opening 21' within heat sink 13 for releasably securing bolt 41, opening 21'' within heat sink 14 for releasably securing bolt 42, opening 33 within heat sink 15 for releasably securing bolt 44, and opening 33' within heat sink 16 for releasably securing bolt 43. A plurality of nuts 53, are also employed to engage the threaded bolts to either directly or indirectly transmit pressure upon AC heat sink means 4 and the DC heat sink means 6 thereby sandwiching the rectifying devices 2 under compression. The nuts 53 employed adjacent to the insulating sleeves 46, 48 and 50 and the insulating washers 47, 49 and 51 are preferably utilized with metal washers 54 positioned between the insulating members and the nuts 53 while additional locking nuts 55 may also be utilized. The nuts 53 which are in contact with the heat sinks assist the adjacent heat sinks in transmitting pressure to the rectifying devices 2.

When the assembly is secured under compression, the alternating control conductive bolts 40, 41 and 42 are in thermal and electrical conductive contact with the AC heat sink 12, 13 and 14, respectively, while being completely electrically insulated from the DC heat sinks 15 and 16. In like manner, the direct current conducting bolts 43 and 44 are in direct thermal and electrical contact with the DC heat sink 16 and 15, respectively, while being completely electrically insulated from the AC heat sinks 12, 13 and 14. The current conducting bolts 40 through 44 threaded into the heat sinks and securing nuts 53 thus provide an economical and highly desirable means for securing the plurality of rectifying devices 2 under the requisite pressure while also supplying an alternating current input and a direct current output to the plurality of rectifying devices. The bolt 45 functions to supply compressive forces to the adjacent heat sinks but could also be readily connected to conduct electrical signals or currents if desired.

The bolts 40, 42 and 44 each provide an outer end 56 which is secured to an isolating insulator 57 which, in turn, is mounted or connected to one of two mounting brackets 58. In such manner, the assembly is readily connected to a control panel, cabinet or other protective surroundings.

As shown in FIG. 5, the alternating current conducting bolts 40, 41 and 42 provide outer ends 59, 60 and 61, respectively, while the direct current conducting bolts 43 and 44 provide outer ends 62 and 63, respectively, while pass through openings or bores 64 within a printed circuit board 65.

A plurality of current conducting sleeves 66 are provided with each employed about one of the end portions 59 through 63 of bolts 40 through 44, respectively, to electrically connect the printed circuit board 65 to the rectifying devices 2. Specifically, each sleeve 65 surrounds a respective bolt and engages either nuts 53 or 55 and further engages of a plurality of conductive foils 67 located on board 65 which form a part of the printed circuits thereon. The sleeves 66 thus provide direct electrical contact between the current conducting bolts 40 through 44 to provide A.C. and D.C. signals from the plurality of rectifying devices 2 to other circuit elements located upon the printed circuit board 65.

A plurality of toroidal shaped inductance cores 68 are located about the outer most portions 59 through 63 of bolts 40 through 44, respectively, and supply a series line inductance to the current flow for smoothing out any transient current conditions which might occur. The cores 68 are secured to the printed circuit board 65 by a plurality of nuts 69 and washers 70 which also assist in connecting the circuit board 65 to the heat sinks through the bolts 40 through 44. Three alternating current leads 71, 72 and 73 are connected to the outer ends 59, 60 and 61 of bolts 40, 41 and 42, respectively, by a plurality of nuts 74 with each lead conducting one phase of the three phase input to the controlled rectifiers 2. A pair of direct current leads 75 and 76 are connected to the outer ends 62 and 63 of bolts 43 and 44, respectively, by a plurality of nuts 77 and conduct forward and reverse direct current between the motor armature circuit and the controlled rectifiers 2.

A pair of alternating current sensing transformers 78 and 79 are positioned about the AC conductive bolts 40 and 42, respectively. Specifically, the transformers are connected to the printed circuit board 65 by bolts 80 and surround the current conducting sleeves 66. The current transformers 78 and 79 provide a secondary output circuit for sensing the alternating current passing through the respective bolts 40 and 42 which thus act as the primary circuits for the sensing transformers. The output from the current transformers 78 and 79 provides an electrical control signal proportional to the alternating current input flowing through bolts 40 and 42 and is utilized within the armature control circuit, such as illustrated in the U.S. Pat. No. 3,716,771. Although not shown, the conductive foils 67 together with other conductive foils upon board 65 extend and electrically connect other circuit components mounted upon the board.

FIGS. 8, 9 and 10 show an alternative embodiment of the invention which includes a heat sink mounting assembly 81 in which three levels or layers of heat dissipating elements are used to sandwich two levels of layers of controlled rectifiers. Specifically, three heat sinks 82, 83 and 84 are electrically connected to conduct alternating current and spaced within a substantially common plane constituting an intermediate heat dissipating layer 85 which exists between two levels or layers 86 and 87 of rectifying elements. The controlled rectifiers within layer 86, in turn, are sandwiched between the heat sink layer 85 and an outer heat dissipating layer 88 which includes a heat sink 89 which is electrically connected to conduct direct current. The controlled rectifiers within layer 87 are sandwiched between the heat sink layer 85 and an outer heat dissipating layer 90 which includes a heat sink 91 which is connected for the conduction of direct current, as more fully described hereinafter.

The heat sinks within the layers 85, 88 and 90 are held in position for sandwiching the controlled rectifier layers 86 and 87 by three bolts 92, 93 and 94 with the bolts 93 and 94 connected to conduct direct current to and from the controlled rectifiers within layers 86 and 87 are more fully described hereinafter.

The layer of controlled rectifiers 86 includes six rectifying devices 95 each of which provides a first side 96 which is electrically and thermally connected to the heat sink layer 88 and a second side 97 which is electrically and thermally connected to the heat sink layer 85. The layer of controlled rectifiers 87 also includes six rectifying devices 98 each of which includes a first side 99 which is electrically and thermally connected to the heat sink layer 85 and a second side 100 which is electrically and thermally connected to the heat sink layer 90. Specifically, the rectifying devices 101, 102 and 103 each have their anode circuits connected to the heat sink layer 88 and their cathode circuits connected to the heat sink layer 85 while the rectifying devices 104, 105 and 106 each have their cathode circuits connected to the heat sink layer 88 and their anode circuits connected to the heat sink layer 85. Furthermore, the rectifying devices 107, 108 and 109 have their anode circuits connected to the heat sink layer 85 and their cathode circuits connected to the heat sink layer 90 while the rectifying devices 110, 111 and 112 have their cathode circuits connected to the heat sink layer 85 and their anode circuits connected to the heat sink layer 90.

The heat sink 89 comprising the heat sink layer 88 provides an outer surface 113 which is electrically and thermally connected to the sides 96 of the rectifying devices 101 through 106. The heat sink 90 comprising the heat sink layer 90 provides an outer surface 114 which is electrically and thermally connected to the sides 100 of the rectifying devices 107 through 112.

The heat sink 91 contains three bores or openings 115, 116, and 117 for receiving the bolts 92, 93 and 94 respectively. Specifically, bolt 92 is surrounded by an insulating sleeve 118 which passes through the opening 115. In a similar manner, the bolt 94 is surrounded by an insulating sleeve 119 which passes through the opening 117. The insulating sleeves 118 and 119 are effective for electrically insulating bolts 92 and 94, respectively, from the heat sink 91. The opening 116, on the other hand, is threaded for securely engaging the threads 120 of bolt 93 so that excellent electrical contact exist between the heat sink 91 and the bore 93.

The heat sink 91 provides a number of cooling fins 121 which extend outwardly in a direction opposite of side 114. The fins or ribs 121 are separated by adjacent valleys 122 which generally extend the length of heat sink 91. The fins 123 and the adjacent valleys 124, however, are interrupted by outer surfaces 125, 126 and 127 which are adjacent to openings 115, 116 and 117, respectively. As clearly illustrated in FIG. 10, the valleys 124 included portions which constitute sloping surfaces 128 which are at an angle with respect to the adjacent surfaces 125, 126 and 127 and to the ribs or fins 121 and 123.

The heat sink 89 is substantially similar to heat sink 91 so that identical or substantially similar parts are designated by corresponding numbers primed and further discussion thereof is deemed unnecessary. The substantial difference between heat sink 89 and heat sink 91 is in the size of openings 115', 116' and 117' and the interconnection with the bolts 92, 93 and 94. Specifically, the opening 115' of heat sink 89 is threaded to removably engage the threads 129 of bolt 92 to maintain good electrical contact therebetween. An insulating sleeve 130 surrounds bolt 93 and passes through the opening 116' to completely electrically insulate bolt 93 from the heat sink 89. The opening 117' in heat sink 89 is threaded for releasably engaging the threads 131 on bolt 94 so that good electrical contact exists therebetween.

The heat sinks 82, 83 and 84 are constructed in an identical manner so that heat sink 84 will be described in detail while elements of heat sinks 82 and 83 will be identified by identical numbers primed and double primed, respectively. The heat sink 84 includes an elongated rectangular portion 132 which includes oppositely disposed outer surfaces 133 and 134 and a centrally located opening or bore 135. Specifically, the outer surface 133 is disposed in good electrical and thermal contact with the outer surface 99 in the rectifier layer 87 of rectifying devices 98 and is specifically connected to rectifying devices 107 and 110. The outer surface 134, on the other hand, is electrically and thermally connected to the outer surface 97 in the rectifier layer 86 of the rectifying devices 95 and specifically is connected to the rectifying devices 101 and 104.

The bolt 94 and the surrounding insulator 119 passes through the opening 135 and, together with the rectifier layers 86 and 87, retains the heat sink 84 sandwiched between the heat sinks 89 and 91. The insulator 119 provides complete electrical insulation between the bolt 96 and the heat sink 84. It is further noted that the insulator 130 electrically insulates the bolt 93 from the heat sink 83 while the insulator 118 electrically insulates the bolt 92 from the heat sink 82.

The heat sink 84 further includes oppositely disposed outer end portions 136 and 137 with end 136 providing a terminal or electrical connection 138 which is connected to a lead 139.

The end portions 136 and 137 each includes a heat removal portion 140 which are similarly constructed. Specifically, a plurality of oppositely disposed fins or ribs 141 are separated by adjacent valleys 142, both of which generally extend widthwise across the heat sink 84.

The longitudinal orientation of heat sink 84 which extends from end 136 to end 137 is disposed at a substantially 90° angle with respect to the longitudinal orientation of heat sinks 89 and 91. The lengthwise fins 121 and 121' of heat sinks 89 and 91, respectively, are located in substantial parallel alignment with the widthwise fins 141, 141' and 141'' of the heat sinks 84, 83 and 82, respectively. The substantial parallel alignment of all cooling fins greatly enhances the cooling capabilities of the assembly in permitting the unidirectional flow of cooling fluid, such as air to provide maximum heat transfer for all heat sinks within the assembly.

The assembly including the heat sink layers 85, 88 and 90 and the sandwiched rectifier layers 86 and 87 may conveniently be connected to a single mounting bracket such as 58 in a manner similar to that discussed with respect to the embodiment shown in FIGS. 1 and 2. Specifically, the threads 129 of bolt 92 and the threads 131 of bolt 94 each engage the threaded opening 142 of an associated isolating insulator 143 which completely electrically insulates the heat sinks and rectifying devices from the mounting bracket 58 and other surrounding equipment. The insulators 143 further operate with bolts 92 and 94 to provide pressure upon surfaces 125' and 127' of heat sink 89 for compressing the rectifier layers 86 and 87 between the surrounding heat sink layers.

The insulating member 130 surrounding bolt 93 extends beyond the fin 123' and the outer surface 126' and is surrounded by an insulating washer 144. A lock nut 145 releasably engages the outer threads 146 of bolt 93 for applying pressure to the heat sink 89. The sleeve 130 together with washer 144 electrically insulates the heat sink 89 from the bolt 93 and locking nut 145.

The bolt 92 contains outer threads 147 which releasably engage a pair of nuts 148 and 149 with nut 148 secured against an insulating washer 150 and the outer end of sleeve 118. The washer 150 surrounds sleeve 118 which extends beyond surface 125 and assists in completely electrically insulating the heat sink 91 from bolt 92. The nut 148 thus operatively applies pressure upon heat sink 91 through washer 150 and functions with the oppositely disposed insulator 143 for compressing the sandwiched rectifier and heat sink layers.

The insulating sleeve 119 also extends beyond the outer surface 127 and is surrounded by an insulating washer 151. A pair of locking nuts 152 releasably engage the outer threads 153 of bolt 94 and operatively apply pressure upon the heat sink 91 through washer 151 and function with the oppositely disposed insulator 143 for compressing sandwiched rectifier and heat sink layers. An electrical terminal or connection 154 is connected with suitable washers to the bolt 94 by a nut 155 and is connected to a lead 156. Thus, an electrical circuit is completed through lead 156, connection 154, bolt 94 to the heat sink 89 which is completely electrically insulated from the heat sink layers 85 and 90 by the insulating sleeves 118, 119 and 130 and various insulating washers.

A locking nut 157 releasably engages threads 120 and directly applies pressure upon surface 126 of heat sink 91 and functions with nut 145 for compressing the sandwiched rectifier and heat sink layers. An electrical terminal or connector 158 is connected with suitable washers to the bolt 93 by a nut 159 and is connected to a lead 160. Thus, an electrical circuit is completed through lead 160, connector 158, bolt 93 to the heat sink 91 which is completely electrically insulated from the heat sink layers 85 and 88 by the insulating sleeves 118, 119 and 130 and various insulating washers.

The heat sink layers 85, 88 and 90 thus sandwich the rectifier layers 86 and 87 under preselected compression to maintain ideal electrical and thermal connection between the rectifiers and heat sinks.

The assembly shown in FIGS. 8-10 thus provides three layers of heat sinks which sandwich two layers of rectifiers to provide an electrical current conversion from A.C. power to D.C. power by supplying a three phase alternating current input to terminals 138, 138' and 138'' through leads 139, 139' and 139'', respectively, while providing a direct current output through terminals 154 and 158 and leads 156 and 160. Thus, the three phases of alternating current input at leads 139, 139' and 139'' are connected to the A.C. heat sinks 84, 83 and 82, respectively, to provide an A.C. input to the controlled rectifiers within layers 86 and 87. The controlled rectifiers 95 and 98 are selectively fired or rendered conductive to provide a direct current output to the heat sinks 89 and 91 and thus to the output leads 156 and 160 through connectors 154 and 158 and bolts 94 and 93, respectively.

The bolts 93 and 94 thus facilitate or assist in transmitting sandwiching pressure upon the assembly to maintain ideal electrical and thermal contact between the heat sinks and the sandwiched controlled rectifiers and also provide an electrical connection to the controlled rectifiers. The bolt 92 is connected for only assisting the transmission of sandwiching pressure upon the assembly but could also be readily used to conduct electrical current if desired.

While not shown in FIGS. 8-10, it is contemplated that a printed circuit board such as 65 with conduction foils 67 illustrated in FIGS. 1 and 2 could be physically and electrically connected to the outer ends of bolts 93 and 94. In addition, a plurality of toroidal shaped inductance cores such as 68 as illustrated in FIGS. 2 and 3 could be connected to bolts 93 and 94 between the connectors 158 and 154 and the heat sink 91 for smoothing any possible current transients. Also, current sensing transformers such as 78 and 79 illustrated in FIGS. 2 and 3 could be coupled to the bolts 93 and 94 to sense ripple signals in the D.C. current for providing output signals indicative of the current flow.

It is therefore evident that a very desirable assembly is provided for securing a plurality of rectifying devices for supplying power to a DC motor armature control circuit. The assembly effectively eliminates heat from the 12 rectifying devices which operate as a pair of gated rectifier bridge networks through the use of only three alternating current heat sinks and two direct current heat sinks.

In addition, the plurality of AC heat sinks are longitudinally orientated at an approximately 90° relationship with respect to the longitudinally orientation of the DC heat sinks and yet the plurality of cooling ribs or fins remain orientated in a substantially parallel relationship to permit efficient heat removal by circulatory air or other coolant.

The specially designed sloping valleys within the heat sinks which are located adjacent to pressure receiving outer surfaces permits effective heat removal by the adjacent fins while also permitting the heat sinks to withstand substantial compression when sandwiching the plurality of rectifying devices.

The plurality of securing elements thus are effective for providing many desirable functions including the supplying of pressure upon the rectifying functions including the supplying of pressure upon the rectifying devices through the heat sinks, while conducting both alternating and direct currents to and from the rectifying devices in a sophisticated power converting apparatus.

It is therefore evident that the invention as illustrated in both the preferred and alternative embodiments can be conveniently utilized in converting A.C. power to D.C. power, D.C. power to A.C. power, or A.C. power of one frequency to A.C. power of a second frequency.

Various modes of carrying out the invention are contemplated as being within the scope of the following claims particularly pointing out and distinctly claiming the subject matter which is regarded as the invention.

We claim:

1. An assembly, comprising electric power rectifying means, first heat sink means including a first member having a plurality of spaced first cooling fins providing a first cooling fluid passageway and a second member having a plurality of spaced second cooling fins providing a second cooling fluid passageway with said first and second heat sink members spaced substantially within a common first plane and abutting a first side of said rectifying means, second heat sink means including a third member located within a second plane and providing a plurality of spaced third cooling fins providing a third cooling fluid passageway and abutting a second side of said rectifying means, said rectifying means including a first rectifying device sandwiched between said first and third heat sink members and a second rectifying device sandwiched between said second and third heat sink members, said first, second and third cooling fins aligned substantially in parallel and permitting unidirectional coolant flow through said first, second and third fluid passageways provided by said first, second and third heat sink members, respectively, means securing said first and second heat sink means in spaced relationship with respect to each other and in engagement with said rectifying means, and means operatively connected to said rectifying means and supplying a first current frequency input and a second current frequency output.

2. The assembly of claim 1, wherein said first, second and third heat sink members each have an elongated shape, said first and second fluid passageways extending in a substantially axial direction of said first and second heat sink members, respectively, and said third passageway extending in a substantially transverse direction of said third heat sink member.

3. The assembly of claim 1, wherein said first, second and third heat sink members each have an elongated shape, said first and second fluid passageways extending in a substantially transverse direction of said first and second heat sink members, respectively, and said third passageway extending in a substantially axial direction of said third heat sink member.

4. The assembly of claim 1, wherein said first and second heat sink means sandwich a first portion of said rectifying means including said first and second rectifying devices, and including third heat sink means retained in spaced relationship with said first heat sink means by sandwiching a second portion of said rectifier means, said third heat sink means including a fourth heat sink member providing a plurality of spaced fourth cooling fins having a fourth cooling fluid passageway therebetween, said second rectifying portion including a third rectifying device sandwiched between said first and fourth heat sink members and a fourth rectifying device sandwiched between said second and fourth heat sink members, said fourth cooling fins aligned substantially in parallel with said first, second and third cooling fins and permitting the unidirectional coolant flow through said fourth fluid passageway.

5. The assembly of claim 4, wherein said first, second, third and fourth heat sink members each have an elongated shape, said first and second fluid passageways extending in a transverse direction of said first and second heat sink members, respectively, and said third and fourth fluid passageways extending in an axial direction of said third and fourth heat sink members.

6. The assembly of claim 1, wherein said first and second heat sink members each includes an intermediate portion having oppositely disposed first and second sides which are connected to said first and second rectifying portions, respectively, and oppositely disposed first and second end members connected to said intermediate member and containing said respective cooling fins for removing heat from said first and second rectifying portions.

7. An assembly, comprising electric power rectifying means having first and second oppositely disposed sides and changing a first current frequency to a second current frequency and providing a desired electrical power output, first heat sink means electrically and thermally connected to said first side of said rectifying means and including three spaced heat dissipating members each being longitudinally aligned in parallel with respect to each other within a first plane, second heat sink means electrically and thermally connected to said second side of said rectifying means and including two spaced heat dissipating members each being longitudinally aligned in parallel with respect to each other within a second plane, the longitudinal orientation of said first heat dissipating members being at an approximate 90° relationship to the longitudinal orientation of said second heat dissipating members, first and second clamping means connected to said first and second heat sink means and retaining said rectifier means sandwiched under pressure by said first and second heat sink means, first insulating means electrically insulating said first clamping means from said second heat sink means, second insulating means electrically insulating said second clamping means from said first heat sink means, first connecting means electrically connected to said first clamping means and supplying a first current frequency to said first side of said rectifying means through said first heat sink means, and second connecting means electrically connected to said second clamping means and supplying a second current frequency to said second side of said rectifying means through said second heat sink means.

8. The assembly of claim 7, wherein said three heat dissipating members each includes a plurality of spaced first cooling fins aligned in parallel and providing a plurality of spaced first cooling fluid passages and said two heat dissipating members each includes a plurality of spaced second cooling fins aligned in parallel and providing a plurality of spaced second cooling fluid passages aligned in spaced relationship with respect to said first cooling fluid passages and permitting unidirectional cooling of said five heat dissipating members.

9. An assembly, comprising electric power rectifying means changing a first current frequency to a second current frequency and providing a desired electrical power output, first current conducting means, second current conducting means separated from said first current conducting means, first heat sink means including a first heat sink member electrically connected to said first current conducting means, second heat sink means including a second heat sink member electrically connected to said second current conducting means, said first and second heat sink means retained in spaced relationship by sandwiching said rectifying means in electrical and thermal conductive engagement, said first current conducting means including a conducting member passing through an opening in said second heat sink member and directly electrically connected to said first heat sink member, insulating means connected to electrically insulate said first current conducting member from said second heat sink means, and electrical input means connected to said first conducting member and supplying said first current frequency to said rectifying means through said opening within said second heat sink member and directly to said first heat sink member, said input means connected to said second conducting means and supplying said second current frequency to said rectifying means through said second conducting means and said second heat sink means.

10. The assembly of claim 9, and including an isolation insulating member connected to said first current conducting member, and mounting means connected to said isolation insulating member and supporting said rectifying means.

11. The assembly of claim 1, and including compression means operatively connected to said first conducting member and to said first and second heat sink means and applying pressure upon said rectifying means to maintain good electrical and thermal conductive engagement between said rectifying means and said first and second heat sink means.

12. The assembly of claim 11, wherein said first conducting member includes a rod-like bolt, and said compression means includes a plurality of nuts rotatably mounted in threaded engagement about said bolt and operatively connected to said first and second heat sink means.

13. The assembly of claim 12, wherein said insulating means electrically insulates said bolt and nuts from said second heat sink means.

14. An assembly, comprising electric power rectifying means including a rectifying device having external first and second contact surfaces spaced substantially in parallel and substantially normal to the axis of said device, heat sink means including a heat dissipating first electrode having a first side providing a planar surface disposed generally parallel to and abutting said first contact surface and a second side oppositely spaced from said first side including a plurality of spaced outwardly extending heat radiating elements and a plurality of spaced and substantially parallel valleys defining cooling fluid passageways, said second side including a force transmitting surface providing a surface edge spaced from said axis of said device and a recess located between a pair of said heat radiating elements having a bottom portion extending at an incline from said force transmitting surface toward said first side, a second electrode engaging said second contact surface of said device, force applying means providing a clamping force to said force transmitting surface and operatively to said second contact surface and forcing said planar surface into intimate heat and electrical engagement with said first contact surface and providing substantially uniform rectifier clamping pressure, and means operatively connected to said first and second electrodes and supplying a first current frequency input and a second current frequency output.

15. The assembly of claim 14, wherein said second electrode provides heat dissipation and includes a first side providing a planar surface disposed generally parallel to and abutting said second contact surface and a second side oppositely spaced from said first side including a plurality of spaced outwardly extending heat radiating elements and a plurality of spaced and substantially parallel valleys defining cooling fluid passageways, said second side of said second electrode including a force transmitting surface providing a surface edge spaced from said axis of said device and a recess located between a pair of said heat radiating elements having a bottom portion extending at an incline from said force transmitting surface toward said first side, said force applying means providing a clamping force directly to said force transmitting surfaces of said first and second heat dissipating electrodes and providing substantially uniform rectifier clamping pressure.

16. The apparatus of claim 15, wherein said first and second heat dissipating electrodes each provides an opening communicating with said force transmitting surface and said first side, said force applying means including a force transmitting member located within said openings provided by said first and second electrodes and functioning to operatively provide clamping force directly to said force transmitting surfaces and providing substantially uniform rectifier clamping pressure.

17. An assembly, comprising a plurality of rectifying devices changing a first current frequency to a second current frequency and providing a desired electrical power output, a first, second, third, fourth, fifth and sixth securing members positioned in spaced relationship with respect to each other, a first, second, third, fourth, and fifth electrically conductive heat sinks each having a plurality of openings retaining certain ones of said securing members in spaced relationship, said first heat sink retaining said first and fourth securing members, said second heat sink retaining said second and sixth securing members, said third heat sink retaining said third and fifth securing members, said fourth heat sink retaining said first, fifth, and sixth securing members, said fifth heat sink retaining said second, third and fourth securing members, said first, second, and third heat sinks spaced with respect to each other in an approximate common first plane and said fourth and fifth heat sinks spaced with respect to each other in an approximate common second plane, said plurality of rectifying devices located between said first and second planes so that each of said rectifying devices is removably connected to one of said heat sinks within said first plane and to one of said heat sinks within said second plane, compression means operatively connected to said first, second, third, fourth, fifth and sixth securing members and to said first, second, third, fourth, and fifth heat sinks and transmitting pressure upon said plurality of rectifying devices through said first, second, third, fourth and fifth heat sinks, electrical connecting means electrically connected to said first, second and third heat sinks and supplying said first current frequency to said plurality of rectifying devices and further electrically connected to said fourth and fifth heat sinks and supplying said second current frequency to said plurality of rectifying devices.

18. The assembly of claim 17, wherein said first, second, third, fourth, fifth and sixth securing members each includes a bolt having threaded portions adjacent to said corresponding heat sinks, and said compression means includes a plurality of threaded nuts which engage the threaded portions of said bolts and operatively apply pressure upon said heat sinks.

19. The assembly of claim 18, including first insulating means electrically insulating said first, second and third securing members from said fourth and fifth heat sinks, and second insulating means electrically insulating said fourth and fifth securing members from said first, second, and third heat sinks, said first, second, and third securing members including electrically conductive elements connected to said electrical connecting means and supplying said first current frequency to said plurality of rectifying devices through said first, second and third heat sinks, said fourth and fifth securing members including electrically conductive elements connected to said electrical connecting means and supplying said second current frequency to said plurality of rectifying devices through said fourth and fifth heat sinks.

20. The assembly of claim 19, and including a current sensing transformer operatively connected to one of said first, second and third securing members and providing an output signal proportional to the sensed current.

21. An assembly, comprising electric power rectifying means having first and second rectifying portions changing between an alternating current frequency and a direct current frequency and providing a desired electrical power output, first heat sink means including a direct current conducting heat sink member electrically and thermally connected to said first rectifying portion, second heat sink means including three spaced alternating current conducting heat sink members electrically and thermally connected to said first and second rectifying portions, third heat sink means including a direct current conducting heat sink member electrically and thermally connected to said second rectifying portion, said first and second heat sink means retained in spaced relationship by sandwiching said first rectifying portion, said second and third heat sink means retained in spaced relationship by sandwiching said second rectifying portion, clamping means operatively connected to said first, second and third heat sink means and maintaining good electrical and thermal contact between said heat sink means and said rectifying means, and electrical connecting means electrically connected to said first and third heat sink means and supplying said direct current frequency to said rectifying means and further connected to said second heat sink means and supplying said alternating current frequency to said rectifying means.

22. The assembly of claim 21, wherein said clamping means includes a first securing member electrically connected to said first heat sink means and located within openings provided by said second and third heat sink means, a second securing member electrically connected to said third heat sink means and located within openings provided by said first and second heat sink means, said electrical connecting means connected to said first and second securing members and supplying said alternating current frequency to said rectifying means through said first and third heat sink means, and including insulating means connected to said first and second securing members and electrically insulating said first securing member from said second and third heat sink means and electrically insulating said second securing member from said first and second heat sink means.

23. The assembly of claim 22 wherein said clamping means further includes a plurality of threaded nuts, and said first and second securing members each includes a threaded bolt which removably engages said nuts for securing said first, second and third heat sink means in good electrical and thermal contact with said sandwiched rectifying means.

24. An assembly, comprising a plurality of electric power converting rectifying devices, a first plurality of alternating current conducting members, a second plurality of direct current conducting members spaced from said first plurality of members, alternating current heat sink means having a plurality of openings retaining said first and second conducting members, direct current heat sink means having a plurality of openings retaining said first and second conducting members, said alternating and direct current heat sink means retained in spaced relationship by engaging said plurality of rectifying devices, first insulating means electrically insulating said first conducting members from said direct current heat sink means, second insulating means electrically insulating said second conducting members from said alternating current heat sink means, input means connected to said first conducting members and supplying an alternating current input to said plurality of rectifying devices through said first conducting members and said alternating current heat sink means, and output means connected to said second conducting means and supplying a direct current output from said plurality of rectifying devices through said direct current heat sink means and said second conducting members.

25. The assembly of claim 24, and further including compression means operatively connected to said first and second current conducting members and to said alternating current and direct current heat sink means and applying pressure upon said plurality of rectifying devices through said alternating current and direct current heat sink means.

26. The assembly of claim 24, and including a plurality of isolation insulating members connected to selected ones of said first and second conducting members, and mounting means connected to said isolation insulating members and supporting said rectifying devices.

27. An assembly, comprising electric power rectifying means changing a first current frequency to a second current frequency and providing a desired electrical power output, first current conducting means, second current conducting means spaced from said first conducting means, first heat sink means including a first heat sink member electrically connected to said first conducting means and having at least one opening therein, second heat sink means including a second heat sink member electrically connected to said second conducting means and having at least one opening therein, said first and second heat sink means retained in spaced relationship by sandwiching said rectifying means in electrical and thermal conductive engagement, said first conducting means including a first conducting member passing through said opening within said second heat sink member and directly electrically connected to said first heat sink member and said second conducting means including a second conducting member passing through said opening within said first heat sink member and directly connected to said second heat sink member, first insulating means electrically insulating said first conducting means from said second heat sink means, second insulating means electrically insulating said second conducting means from said first heat sink means, first terminal means connected to said first conducting means and conducting a first current frequency through the opening within said second heat sink member to said rectifying means through said first conducting member and said first heat sink means, and second terminal means connected to said second conducting means and conducting a second current frequency from said rectifying means through said second heat sink means and said second conducting means.

28. An assembly, comprising electric power rectifying means changing a first current frequency to a second current frequency and providing a desired electrical power output, first current conducting means, second current conducting means separated from said first current conducting means, first heat sink means electrically connected to said first current conducting means, second heat sink means electrically connected to said second current conducting means, said first and second heat sink means retained in spaced relationship by sandwiching said rectifying means in electrical and thermal conductive engagement, said first current conducting means passing through an opening in said second heat sink means, insulating means electrically insulating said first current conducting means from said second heat sink means, electrical connecting means connected to said first conducting means and supplying said first current frequency to said rectifying means through said first conducting means and said first heat sink means and further connected to said second conducting means and supplying said second current frequency to said rectifying means through said second conducting means and said second heat sink means, and a printed circuit board connected to said first conducting means and including a printed circuit connection electrically connected to said first conducting means.

29. An assembly, comprising electric power rectifying means changing a first current frequency to a second current frequency and providing a desired electrical power output, first current conducting means including an electrically conductive rod, second current conducting means separated from said first current conducting means, first heat sink means electrically connected to said first current conducting means, second heat sink means electrically connected to said second current conducting means, said first and second heat sink means retained in spaced relationship by sandwiching said rectifying means in electrical and thermal conductive engagement, said first current conducting means passing through an opening in said second heat sink means, insulating means electrically insulating said first current conducting means from said second heat sink means, electrical connecting means connected to said first conducting means and supplying said first current frequency to said rectifying means through said first conducting means and said first heat sink means and further connected to said second conducting means and supplying said second current frequency to said rectifying means through said second conducting means and said second heat sink means, and a transformer located about said first conductive rod and providing an output signal proportional to the sensed current flowing through said rod.

30. An assembly, comprising electric power rectifying means changing a first current frequency to a second current frequency and providing a desired electrical power output, first current conducting means including an electrically conductive rod, second current conducting means separated from said first current conducting means, first heat sink means electrically connected to said first current conducting means, second heat sink means electrically connected to said second current conducting means, said first and second heat sink means retained in spaced relationship by sandwiching said rectifying means in electrical and thermal conductive engagement, said first current conducting means passing through an opening in said second heat sink means, insulating means electrically insulating said first current conducting means from said second heat sink means, electrical connecting means connected to said first conducting means and supplying said first current frequency to said rectifying means through said first conducting means and said first heat sink means and further connected to said second conducting means and supplying said second current frequency to said rectifying means through said second conducting means and said second heat sink means, and a toroidal shaped line inductor core electrically connected to said rod between said connecting means and said first heat sink means and supplying inductance to said current.

* * * * *

UNITED STATES PATENT AND TRADEMARK OFFICE
CERTIFICATE OF CORRECTION

PATENT NO. : 3,955,122
DATED : May 4, 1976
INVENTOR(S) : John T. Maynard and Gilbert A. Schwibinger It is certified that error appears in the above-identified patent and that said Letters Patent are hereby corrected as shown below:

ABSTRACT

| | |
|---|---|
| Column 2, Line 35, | Cancel "oriented" and substitute therefor ---orientated---; |
| Column 1, Line 42, | After "sink" insert ---means---; |
| Column 2, Line 13, | Cancel "member" and substitute therefor ---members---; |
| Column 6, Line 59, | Cancel "control" and substitute therefor ---contact---; |
| Column 6, Line 64, | Cancel "feature" and substitute therefor ---features---; |
| Column 8, Line 4, | Cancel "device" and substitute therefor ---devices---; |
| Column 8, Line 23, | Cancel "23" and substitute therefor ---33---; |
| Column 9, Line 65, | Cancel "while" and substitute therefor ---which---; |
| Column 11, Line 34, | Cancel "90" and substitute therefor ---91---; |
| Column 12, Line 31, | Cancel "96" and substitute therefor ---94---; |

UNITED STATES PATENT AND TRADEMARK OFFICE
CERTIFICATE OF CORRECTION

PATENT NO. : 3,955,122
DATED : May 4, 1976
INVENTOR(S) : John T. Maynard and Gilbert A. Schwibinger It is certified that error appears in the above-identified patent and that said Letters Patent are hereby corrected as shown below:

Column 15, Line 39, CLAIM 4    Cancel "with" and substitute therefor ---from---;

Column 17, Line 8, CLAIM 11    Cancel "1" and substitute therefor ---9---;

Column 18, Line 56, CLAIM 19    Cancel "18" and substitute therefor ---17---.

Signed and Sealed this

Twenty-third Day of November 1976

[SEAL]

Attest:

RUTH C. MASON
*Attesting Officer*

C. MARSHALL DANN
*Commissioner of Patents and Trademarks*